United States Patent [19]
Masaki et al.

[11] Patent Number: 5,429,843
[45] Date of Patent: Jul. 4, 1995

[54] VAPOR DEPOSITION FOR FORMATION OF PLATING LAYER

[75] Inventors: Katsuhiko Masaki; Minoru Saito; Hideo Miyake; Masahiko Souda; Yukihiro Morita; Yasushi Fukui, all of Osaka, Japan

[73] Assignee: Nisshin Steel Co., Ltd., Tokyo, Japan

[21] Appl. No.: 87,731

[22] PCT Filed: Nov. 19, 1992

[86] PCT No.: PCT/JP92/01511
§ 371 Date: Jul. 19, 1993
§ 102(e) Date: Jul. 19, 1993

[87] PCT Pub. No.: WO93/10275
PCT Pub. Date: May 27, 1993

[30] Foreign Application Priority Data

| Nov. 21, 1991 | [JP] | Japan | 3-333961 |
| Dec. 26, 1991 | [JP] | Japan | 3-359136 |
| Mar. 17, 1992 | [JP] | Japan | 4-091870 |
| Nov. 10, 1992 | [JP] | Japan | 4-324964 |

[51] Int. Cl.⁶ .......................... B05D 3/06; C23C 16/00
[52] U.S. Cl. .......................... 427/534; 427/566; 427/250
[58] Field of Search ............ 427/524, 531, 534, 566, 427/564, 561, 597, 250; 148/239; 156/643

[56] References Cited

U.S. PATENT DOCUMENTS

| 3,642,541 | 2/1972 | Shepard | 427/250 |
| 3,915,757 | 10/1975 | Engel | 427/531 |
| 4,237,192 | 12/1980 | Ito et al. | 427/250 |
| 4,252,837 | 2/1981 | Auton | 427/531 |
| 4,587,135 | 5/1986 | Diener et al. | 427/564 |
| 4,729,905 | 3/1988 | Zhed et al. | 427/534 |
| 4,933,058 | 6/1990 | Bache et al. | 427/524 |
| 4,940,522 | 7/1990 | Kagechika et al. | 427/531 |
| 4,966,668 | 10/1990 | Veistinen | 427/534 |
| 4,978,588 | 12/1990 | Adaniya et al. | 427/250 |
| 4,980,195 | 12/1990 | Olds | 427/531 |
| 5,061,512 | 10/1991 | Upadhya | 427/534 |
| 5,073,403 | 12/1991 | Kagechika et al. | 427/531 |
| 5,270,081 | 12/1993 | Manier et al. | 427/534 |

FOREIGN PATENT DOCUMENTS

| 269112 | 6/1988 | European Pat. Off. | 427/524 |
| 135216 | 4/1979 | Germany | 427/524 |
| 263084 | 12/1988 | Germany | 427/534 |
| 86-141869 | 7/1985 | Japan | 427/524 |
| 86-169372 | 7/1988 | Japan | 427/534 |
| 2080553 | 3/1990 | Japan | 427/524 |
| 2247371 | 10/1990 | Japan | 427/524 |
| 5-78818 | 3/1993 | Japan | 427/531 |
| 1745776 | 7/1992 | U.S.S.R. | 427/524 |

OTHER PUBLICATIONS

Kominkiak et al, "Reactive Plasma Cleaning of Metals", *Thin Solid Films*, 40, 1977 (no month) pp. 141–148.

*Primary Examiner*—Marianne Padgett
*Attorney, Agent, or Firm*—Nikaido, Marmelstein, Murray & Oram

[57] ABSTRACT

The surface of a steel material is irradiated with ion beams, held at a temperature of 100°–400° C. and then subjected to vapor deposition plating in vacuo. The vapor deposition plating may be performed by successively or simultaneously depositing different plating metals. The temperature control may use the sensible heat of the steel material, wherein the vapor deposition plating is applied to the surface of the steel material, which is in the temperature range of 100°–400° C. during cooling after ion beam irradiation, in a vacuum atmosphere. Since the surface of the steel material is held at a temperature of 100°–400°C., a lot of active spots remain on the surface. The active spots serve as starting points for the vapor deposition of the plating metals. The obtained plating layer is excellent in adhesiveness, workability, corrosion resistance and conformability to paint.

5 Claims, 3 Drawing Sheets

VAPOR DEPOSITION FOR FORMATION OF PLATING LAYER

This is a filing under 35 U.S.C. 371 of PCT/JP92/01511, filed on Nov. 19, 1992.

The present invention relates to a method of forming a vapor deposition plating layer excellent in adhesiveness, corrosion resistance, conformability to paint film on the surface of a substrate steel without deteriorating the properties of the steel material.

BACKGROUND OF THE INVENTION

A material such as a steel sheet is coated with a Zn plating layer and then with paint, in order to improve the corrosion resistance of a building or structrual material in various fields of use. The material after being coated with a Zn plating layer is usually subjected to phosphating treatment before paint application. A film composed of fine phosphate crystals is formed on the surface of the substrate material by the phosphating treatment. The phosphate film effectively improves the adhesiveness of a paint film to the surface of the substrate steel, so that the obtained product is excellent in corrosion resistance and weatherability.

Corrosion resistance required for building and structural materials has become more severe, as the environment is getting worse in corrosive condition. In this regards, a material coated with a Zn or Zn alloy plating layer does not exhibit sufficient corrosion resistance, so that corrosion is often observed under the paint film. In addition, a brittle alloyed layer is likely to be formed between the plating layer and the steel substrate. The brittle alloyed layer would cause the formation of various defects such as flaking and powdering in the plating layer, when the coated steel sheet is worked to an objective shape.

In order to acquire enough endurance against the severer environment for use, there have been proposed various improvements such as the selection of substrate steel, the modification of the plating layer in composition and the change of a plating method to improve corrosion resistance. For instance, a stainless steel is used as a substrate to be coated with a Zn plating layer. The Zn-coated stainless steel exhibits extremely excellent corrosion resistance owing to the co-operative effect of the stainless steel with the Zn plating layer.

Vapor depostion plating has been noted in recent years as a substitution for conventional hot-dip or electrolytic plating. According to the vapor deposition, it is possible to obtain a plating layer having a composition, which can not be formed by the conventional method, with the high degree of freedom. For instance, Japanese Patent Application Laid-Open 63-247353 discloses a vapor deposition plating method for forming a Zn-Al alloy plating layer on the surface of a steel sheet. In this method, Zn and Al are independently evaporated from different vessels, and Zn and Al are simultaneously deposited from the vapor phase on the surface of the steel sheet.

The vapor deposition plating layer adheres onto the surface of the steel substrate without substantial reaction between the plating layer and the substrate steel, so that the coated steel sheet exhibits excellent workability as compared with a Zn alloy-coated steel sheet manufactured by a hot-dip plating method or the like. In addition, the coated steel sheet is excellent in corrosion resistance, too, due to Al contained in the plating layer.

However, during the formation of a vapor deposition plating layer, there is a possibility that the plating layer would be formed in a state which has poor adhesiveness and defects such as pores would be involved in response to the surface conditions of the material such as a steel sheet to be coated. In order to improve the adhesiveness of the vapor depostion plating layer, there has been proposed a pretreatment for activating the surface of the steel sheet by electron beam heating, gas reduction or the like before the vacuum deposition of a plating metal on the surface of the steel sheet.

When the surface of the steel sheet is activated by electron beam heating, it is necessary to elevate the surface temperature of the steel sheet at the begining of vapor deposition. For instance, in the case where Ti and Al are to be applied as a first sub-layer and a second sub-layer, respectively, onto the surface of the steel sheet, the surface of the steel sheet shall be heated at a temperature of 400° C. or higher to improve the adhesiveness of the multi-layered plating layer.

However, the heating promotes the diffusion of Al into the substrate steel, so that a brittle intermetallic compound is likely to be formed. Consequently, when the coated steel sheet is worked to an objective shape, there would appear in the plating layer various defects such as peeling, powdering and flaking, just like a coated steel sheet manufactured by the hot-dip coating method. In case where a material such as Zn having a lower volatile point is used as a plating metal, the plating metal is easily re-evaporated from the surface of the steel sheet due to the heat of the activation during vapor deposition. Consequently, it is difficult to obtain a plating layer having the desired composition. In order to avoid such defects, strict temperature control is required to hold the surface of the steel sheet at a temperature below 500° C.

On the other hand, the gas reduction method for activating the surface of the steel sheet requires a large-scale gas reducing furnace and various supplemental equipment. Due to the large scale of the furnace, temperature control in the furnace and sealing mechanism become troublesome, and it takes a long time to raise or lower the temperature of the furnace. Consequently, productivity is lowered.

In a conventional paint applying process line, various steps are combined with each other mainly for applying paint to a Zn-coated steel sheet. When a steel material coated with an Al-Zn alloy plating layer containing a large amount of Al is introduced into this paint applying process line, a phosphate film is not uniformly formed on the surface of the steel material, and a paint film formed thereon lacks homogeneity. Besides, the surface of the steel material would be exposed to the atmosphere at its dent or corner part without the adhesion of paint, especially when the steel material has complicated configuration.

In order to overcome the aforesaid problems, we have proposed a new method whereby the surface of a steel sheet is activated by radiation with ion beams and then subjected to vapor deposition plating, as disclosed in Japanese Patent Application Laid-Open 64-56862. The irradiation with ion beams utilizes the etching reaction derived from the bombardments of accelerated ions beams into the surface of the steel sheet, different from the known method wherein the surface of the steel sheet is thermally activated by electron beam heating. The surface of the steel sheet irradiated with ion beams is converted into a surely activated state suitable as a substrate for a vapor deposition plating layer excellent in adhesiveness.

We have researched and examined the ion beam irradiation from various points of view to further enhance the activation effect. In the course of the research and examination, we have found that the surface temperature of the steel sheet at the beginning of vapor deposition has a big influence on the maintenance of the activated state.

An object of the present invention is to improve the adhesiveness, density and corrosion resistance of a vapor deposition plating layer formed on the surface of a steel material.

Another object of the present invention is to use the activated state of the steel material effectively for vapor deposition plating by maintaining the surface of the steel material at a temperature within the range of 100°–400° C. at the begining of vapor deposition.

DETAILED DESCRIPTION OF THE INVENTION

According to the present invention, there is provided a new coating method wherein the surface of a steel material to be coated with a vapor deposition plating layer is irradiated with ion beams, said surface is maintained at a temperature within the range of 100°–400° C., and then said steel material is subjected to vapor deposition in vacuo.

The steel surface is preferably irradiated with ion beams in a quantity of 0.05 coulomb/m$^2$ or more, to enhance the effect of etching reaction. The vapor deposition may be one wherein different plating metals are successively evaporated to form a multi-layered plating layer, or another wherein different plating metals are simultaneously evaporated to form an alloyed plating layer. In order to maintain the surface of the steel material at a temperature within the range of 100°–400° C., there may be adopted various methods, e.g. heating the surface of the steel material with an independent heating means after the ion beam irradiation, heating the surface of the steel material before the ion beam irradiation, or raising the surface temperature of the steel material with the ion beam irradiation. For instance, in case where an Al-Zn alloy plating layer is to be formed by vapor deposition, Al and Zn may be simultaneously deposited from vapors separately evaporated from different vessels. The obtained Al-Zn alloy plating layer preferably has Zn concentration of 3–30 wt. % at its surface. The Zn concentration in the plating layer may be uniform or changed with a certain gradient along the perpendicular direction of the alloy plating layer. An apparatus for application of ion beams preferably has an ion source which is large in diameter, e.g. Kaufmann-type, bucket-type, saddle field-type or end hole-type.

The discharge of ion beams becomes easier with the enhancement of an accelerating voltage. However, the higher accelerating voltage raises the temperature of a steel material irradiated with the ion beams, as shown in the following formula. The heating of the steel material up to a temperature exceeding 400° C. is inhibited by lowering the accelerating voltage so as to apply ion beams with lower energy.

$$C \rho t \Delta T = Q V$$

C: specific heat (joule/Kg.K) of the steel material
$\rho$: specific weight (Kg/m$^3$) of the steel material
t: thickness (mm) of the steel material
$\Delta T$: the rising degree (K) of a temperature
Q: quantity (coulomb/m$^2$) of applied ion beams
V: accelerating voltage (V)

The surface of the steel material irradiated with ion beams is conditioned into an activated state free from adherent substances and oxide films by the impact energy of the ion beams. The activated state on the surface of the steel material can be kept as such at a higher level just after the ion beam irradiation, when the surface of the steel material is held at a temperature within the range of 100°–400° C. It is not clear why the activated state can be kept by controlling the surface temperature. We suppose the surface temperature control might be effective in the maintenance of the activated state as follows:

Water and oxide films, which usually exist on the surface of a steel material, are removed from the surface after being exposed to ion beam bombardment. The ion beam bombardment forms a lot of active spots on the surface of the steel material by its etching reaction. If the surface temperature is below 100° C., the steel surface would be hardly etched due to Van der Waals force which strengthens the adhering of water and oxide films onto the steel surface. The lower surface temperature promotes the re-adhesion of water onto the steel surface after being etched, too. On the other hand, a surface temperature higher than 400° C. makes the Van der Walls force smaller but promotes the chemical reaction of water and oxide films with the steel surface so as to enlarge the adhering force of water and oxide films onto the steel surface. Consequently, the steel surface is hardly etched with the ion beams, and oxide films are easily re-formed on the steel surface after being etched. Thus, when the surface temperature is lower than 100° C. or higher than 400° C., effective active spots would be formed with a lower density at the begining of vapor deposition.

When a plating metal is vapor deposited on the surface of the steel material in the above-mentioned state, the ratio of plating metal impinging onto an unactivated or poorly activated surface part would be large. As a result, the bonding reaction of the plating metal to the steel surface is not promoted, and there is formed a plating layer poor of adhesiveness. When the surface temperature of the steel material exceeds 400° C. at the begining of vapor deposition, diffusion reaction between the plating metal and the substrate steel occurs violently so as to facilitate the formation of a brittle plating layer.

In general, the adhesiveness of a paint film applied onto a material, which has an Al plating layer formed by vapor deposition and then chemically converted, is not sufficient. When the material such as a steel sheet coated with a paint is exposed to a corrosive atmosphere for a long time, its surface appearance is deteriorated due to the formation of rust or the like derived from corrosion under the paint film. This defect may be caused by the vapor deposited Al plating layer which has poor conformability to a paint film after the chemical conversion and involves a lot of pin holes therein.

On the other hand, when the surface of the steel material is held at a temperature within the range of 100°–400° C., active spots are formed on the surface of the steel material with high density by ion beam irradiation, and a plating metal is vapor deposited onto a steel surface kept while such is in an activated state. The bonding reaction between the plating metal and the surface of the steel material is accelerated, and there are formed a lot of nuclei for the growth of a plating layer originated in the active spots. Consequently, a formed plating layer is improved in adhesiveness and density and has a fine crystalline structure. The plating layer obtained in this way, being free from defects such as pores owing to its physical property, exhibits excellent workability and corrosion resistance. In addition, the high-quality plating layer may be used as an undercoat for applying a second plating layer thereon. In this case, both the first and second layers exhibit excellent adhesiveness so as to further improve the corrosion resistance of the steel material.

Especially when an Al-Zn alloy plating layer is formed by simultaneous vapor deposition, the surface conditioning of a material such as a steel sheet to be coated has a big influence on the density of a plating layer to be formed. According to our various researches on the surface conditioning, the best result to form a sufficiently dense Al-Zn alloy vapor deposition plating layer free from defects such as pores and pin holes is obtained by maintaining the surface of the substrate material at a temperature of 400° C. or lower after the application of ion beams in a quantity of 0.05 coulomb/m$^2$ or more.

The surface of the substrate material after being irradiated with ion beams is converted into a state which includes a lot of active spots from which adherent substances and oxide films have been removed by the impact energy of the ion beams. The activated surface condition of the substrate material is kept at the higher level just after the ion beam irradiation, provided the surface of the substrate material is maintained at a temperature of 400° C. or lower, preferably within the range of 100°–400° C.

When Zn and Al are simultaneously vapor deposited on the activated surface of the substrate material, the bonding reaction between the plating metals and the surface layer of the substrate material is promoted, and there are formed a lot of nuclei for the growth of a plating layer originated in the active spots. Consequently, the formed plating layer is improved in adhesiveness and density, and has a fine crystalline structure. The plating layer comprises an alloy having a predetermined composition without segregation.

The Al-Zn alloy plating layer formed by the vapor deposition exhibits excellent workability and corrosion resistance owing to its physical property without defects such as pores or pin holes. When Zn concentration is controlled within the range of 3–30 wt. % at the surface of the plating layer, the coated steel sheet may be introduced into a conventional coating process line for applying paint to the Zn-coated steel sheet, to form a chemically converted film comprising dense and homogeneous phosphate crystals. The chemically converted film is effective as a substrate surface for forming a paint film excellent in adhesiveness with good throwing power of paint. In addition, good after-painting corrosion resistance is ensured by the vapor deposited Al-Zn alloy plating layer under the paint film.

The Zn concentration of the plating layer shall be maintained within the range of 3–30 wt. % at its surface to improve the effect of after chemical conversion treatment such as phosphating. If the Zn concentration is less than 3 wt. %, a conventional coating process line would be inadequate for the chemical conversion of the steel material coated with the plating layer, while conditions for the chemical conversion treatment of Al material would be rather required. On the other hand, if the Zn concentration at the surface of the plating layer exceeds 30 wt. %, the effect of improving corrosion resistance would become lower with the decrease of Al content in the plating layer. As a result, corrosion resistance such as after-painting corrosion resistance would be worse.

The Zn concentration may be either uniform along the perpendicular direction of the plating layer, or changed with a certain gradient to become higher or lower toward the surface of the substrate steel. Such gradient in Zn concentration may be easily determined by controlling the evaporation rates of Zn and Al being evaporated from separate vessels. For instance, in order to make Zn concentration higher along the direction from the substrate steel toward the surface of the plating layer, the conditions for the simultaneous evaporation of Al and Zn are controlled in such as manner to gradually decrease the evaporation rates of Al or to gradually increase the evaporation rates of Zn. On the contrary, in order to make Zn concentration lower along the direction toward the surface of the plating layer, the evaporation speed of Al is gradually increased or that of Zn is gradually decreased.

BEST MODES OF THE INVENTION

The present invention will be more particularly described in the following examples with reference to the drawings attached.

Example 1: (multi-layered plating of Al/Ti and Zn/Si)

Figure 1:
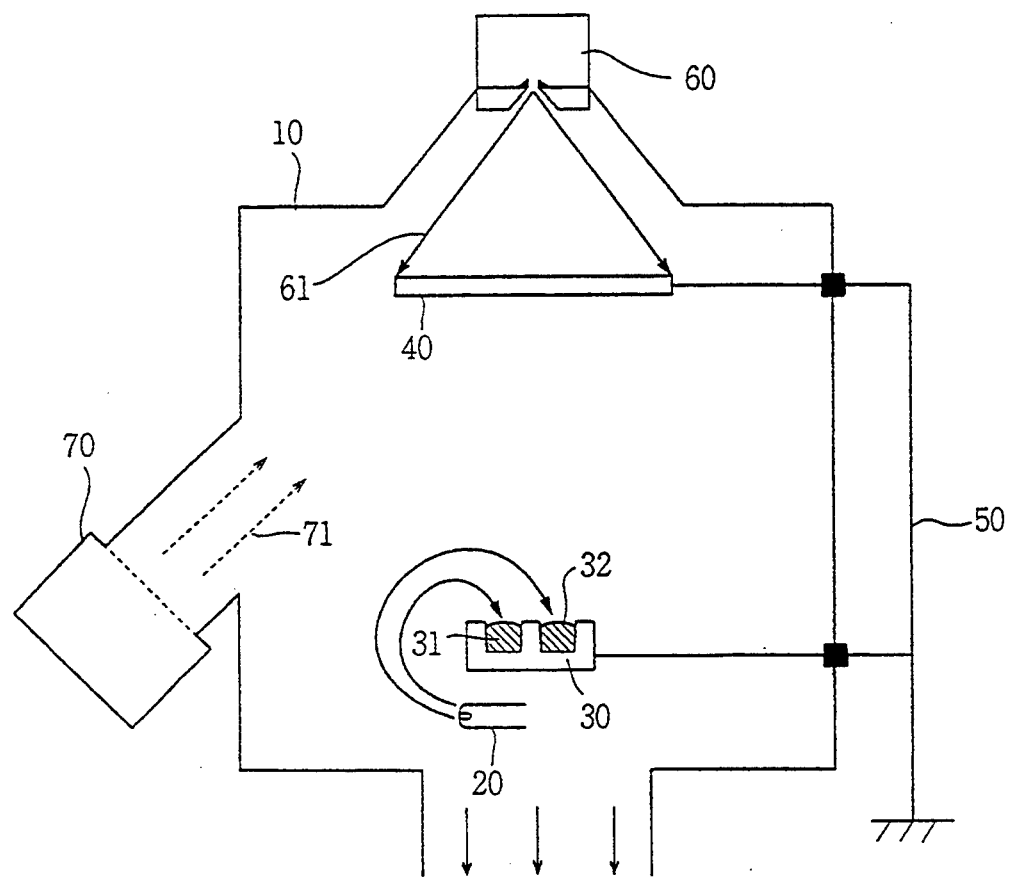
FIG. 1 is a schematic view illustrating an apparatus for vapor deposition employed in the examples of the present invention.

An apparatus for vapor deposition plating had the structure schematically shown in FIG. 1. A water-cooled copper hearth 30 is located at a position just above an electron gun 20 provided in a vacuum chamber 10, to construct an electron beam evaporation source. The copper hearth 30 had two concave parts for separately receiving two kinds of materials 31 and 32 to be evaporated. A steel sheet substrate 40 was set at a position facing to the materials 31, 32.

The copper hearth 30 and the substrate 40 were both grounded through a conductor 50 extending through the wall of the vacuum chamber 10, to maintain the materials 31, 32 received in the copper hearth 30 at the same potential as that of the substrate 40. Another electron gun 60 for heating was provided at the opposite side of the copper hearth 30, to control the temperature of the substrate 40. Electron beams 61 discharged from the electron gun 60 were applied onto the whole surface of the substrate 40, to hold the substrate 40 at a predetermined temperature. An ion source 70 was attached to the side wall of the vacuum chamber 10. The ion source 70 was inclined with respect to the side wall of the vacuum chamber 10 in a manner such that ion beams 71 discharged from the ion source 70 collided against the substrate 40 at an angle of 45 degrees. After the materials 31, 32 and the substrate 40 were positioned in the vacuum chamber 10, the vacuum chamber 10 was evacuated to a vacuum of about $1 \times 10^{-3}$ Pa by a vacuum pump.

The substrate 40 was one prepared by alkaline degreesing an annealed Ti-added steel sheet of 0.6 mm in thickness. The substrate 40 was positioned in the vacuum chamber 10, the vacuum chamber 10 was evacuated to a vacuum degree of $1 \times 10^{-3}$ Pa, and then the substrate 40 was heated by the electron gun 60. Herein, the output power of the electron gun 60 was so adjusted to make the temperature of the heated substrate 40 change within the range from ambient temperature to 500° C.

Ar gas having a purity of 99.999% was used as a source gas for ion beams and introduced into the ion source 70 at a flow rate of 10–15 ml/min. The surface of the substrate 40 was irradiated with ion beams discharged from the ion source 70 at an accelerating voltage of 500V. The quantity of applied ion beams was changed within the range of 0.03–1 coulomb/m$^2$.

The materials 31 and 32 to be evaporated were combined as follows; one combination of Ti material for the first plating sub-layer with Al material for the second plating sub-layer, and another combination of Si material for the first plating sub-layer with Zn material for the second plating sub-layer. Each material was separately received in the concave part of the copper hearth 30. Granulated Ti having a purity of 99.9% was used as the Ti material, while granulated Al having a purity of 99.99% was used as the Al material. Granulated Si having a purity of 99.99% was used as the Si material, while granulated Zn having a purity of 99.9% was used as the Zn material.

The materials 31, 32 were successively heated and evaporated by the application of ion beams from the electron gun 20, to form a multi-layered plating layer on the surface of the substrate 40. In each combination of Al/Ti and Si/Zn, the first and second sub-layers were adjusted to 1 μm and B 5 μm, respectively, in thickness. The thickness of each sub-layer was controlled by changing the deposition time. Each steel sheet substrate coated with a multi-layered plating layer was used as a test piece for examining adhesiveness of the plating layer and corrosion resistance. The test results were studied in the relationship with the temperature of the steel sheet during vapor deposition and the quantity of applied ion beams. There were noticed the relationship shown in FIG. 2 on the adhesiveness and the relationship shown in FIG. 3 on the corrosion resistance.

Figure 2:
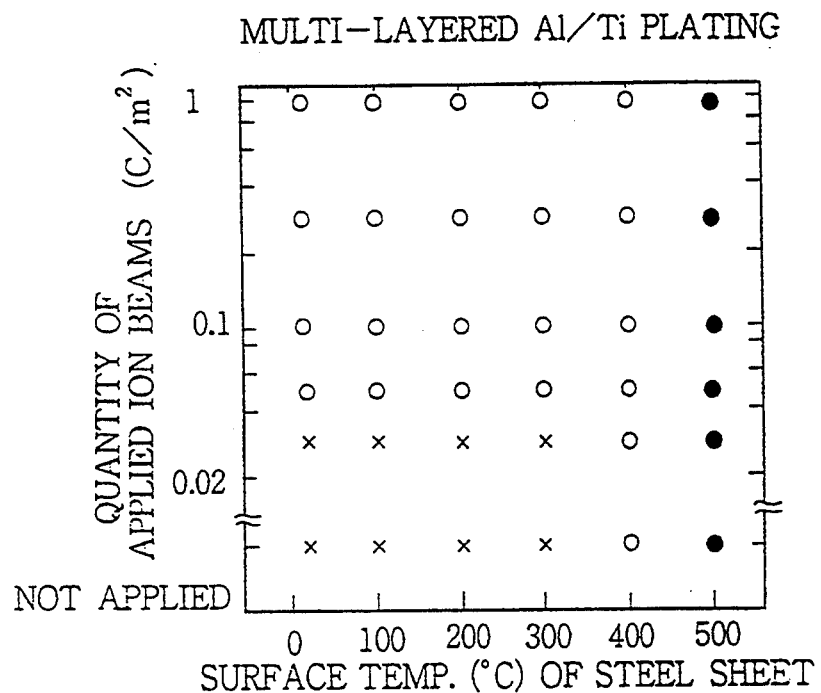
FIG. 2(a) is a graph showing the effect of the temperature of a steel sheet, and the quantity of applied ion beam on the adhesiveness of a multi-layered aluminum-titanium plating layer.
FIG. 2(b) is a graph showing the effect of the temperature of a steel sheet, and the quantity of applied ion beam on the adhesiveness of a multi-layered zinc-silicon plating layer.
Figure 2:
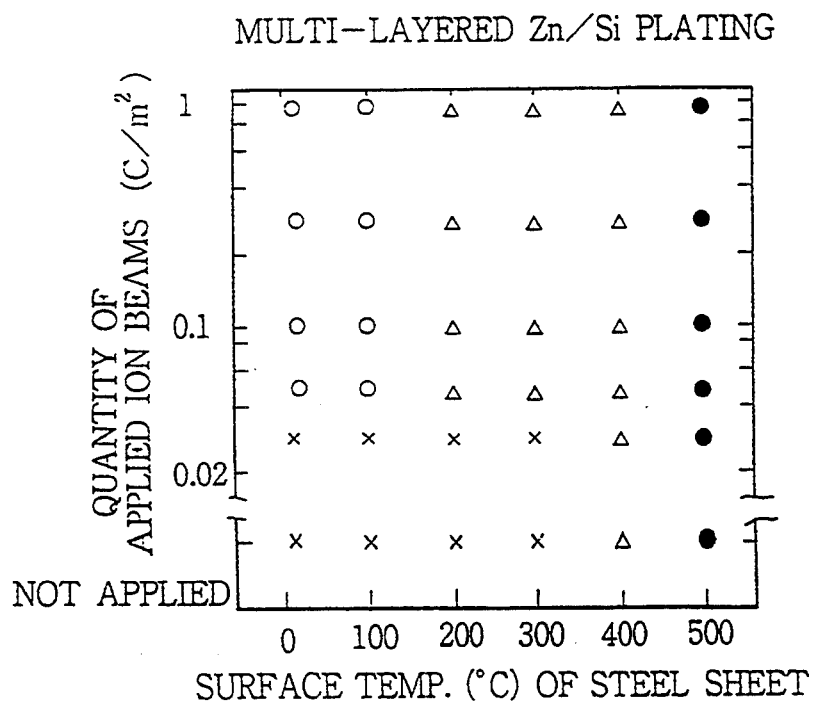

The adhesiveness of the plating layer was examined by a bending test as follows: The test piece was bent while holding the plating layer outside until the surface part of the bent test piece came in face-to-face contact with the other surface part. An adhesive tape was put onto the bent part of the test piece and then peeled off. The plating layer was partially removed from the surface of the test piece in a state adhering onto the adhesive tape. The separation degree of the plating layer was observed, and the adhesiveness of the plating layer was judged in response to the separation degree. In FIG. 2, the mark ○ represents the case where the peeling was not detected in the plating layer, the mark x represents the case where the peeling was detected, and the mark ● represents the case where interlayer splitting was detected between the first and second sub-layers. In the combination of Zn/Si, there were some cases where Zn was partially re-evaporated during vapor deposition although the peeling of the plating layer was not detected in the bending test. Such cases are represented by the mark G in FIG. 2(b).

Figure 3:
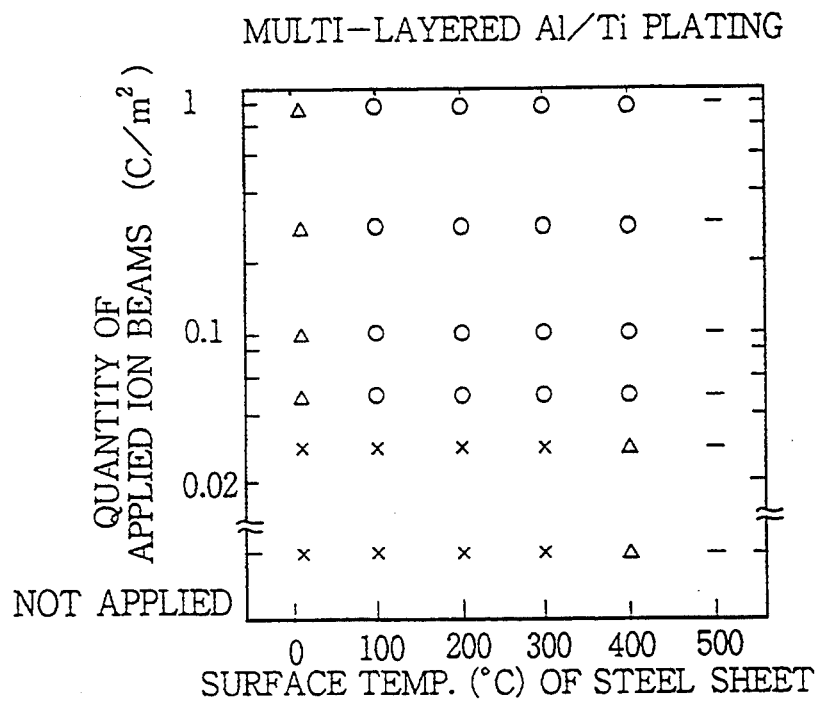
FIG. 3(a) is a graph showing the effect of the temperature of a steel sheet, and the quantity of applied ion beam on the corrosion resistance of a multi-layered aluminum-titanium plating layer.
FIG. 3(b) is a graph showing the effect of the temperature of a steel sheet, and the quantity of applied ion beam on the corrosion resistance of a multi-layered zinc-silicon plating layer.
Figure 3:
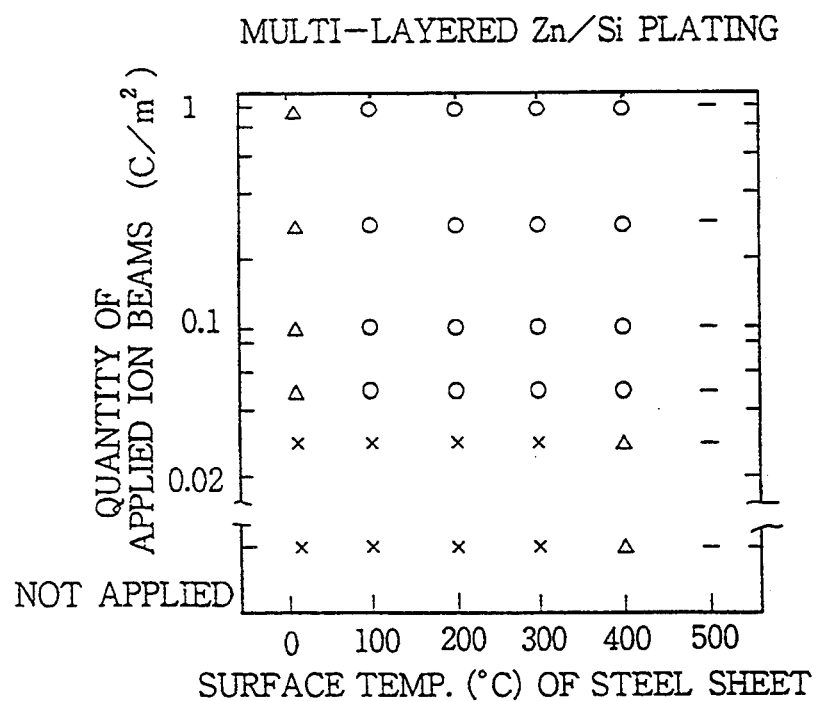

The corrosion resistance was examined by a salt water spray test described in JIS H8502 wherein salt water was sprayed onto one surface of a test piece having opposite and side surfaces sealed. The corrosion resistance was judged as the spray time until 5% of the surface of the test piece was occupied by rust formed thereon. In FIG. 3(a) as for the test piece coated with the Al/Ti plating layer, the mark ○ represents the case where 5% rust was not detected even after the salt water spray test was continued for 1000 hrs., the mark Δ represents the case where 5% rust was detected in the salt water spray time of 500–1000 hrs., and the mark x represents the case where 5% rust was detected in the salt water spray time of 500 hrs. or shorter. In FIG. 3(b) as for the test piece coated with the Zn/Si plating layer, the mark ○ represents the case where 5% rust was not detected even after the salt water spray test was continued for 500 hrs., the mark Δ represents the case where 5% rust was detected in the salt water spray time of 200–500 hrs., and the mark x represents the case where 5% rust was detected in the salt water spray time of 200 hrs. or shorter. In some cases, the first sub-layer was alloyed with the second sub-layer to form an alloyed plating layer which did not exhibit the corrosion resistance of the multi-layered plating layer itself. In this regard, such cases were excluded from the investigation of corrosion resistance and represented by the mark "—" in FIG. 3.

It is apparently understood from FIG. 2 that good adhesiveness was obtained when vapor deposition plating was applied onto the surface of a steel sheet substrate held at a temperature of 100°–400° C. In addition, the formation of brittle intermetallic compound was not detected between the first and second sub-layers, so that the coated steel sheet was worked to an objective shape without the formation of defects such as powdering or flaking.

On the other hand, interlayer splitting was detected between the first and second sub-layers in the bending test in any combination of Al/Ti and Zn/Si, when the first sub-layer was formed on the surface of the steel sheet substrate held at a temperature above 400° C. The interlayer splitting was caused by the formation of brittle intermetallic compounds at the boundary between the first and second sub-layers. When the first sub-layer was formed on the surface of a steel sheet substrate held at a temperature below 100° C, the obtained plating layer lacked in adhesiveness and partially split off in the bending test. When vapor deposition plating was applied to either a steel sheet substrate unirradiated with ion beams or a steel sheet substrate irradiated with ion beams in a small quantity of 0.03 coulomb/m$^2$, the steel sheet substrate was coated with a multi-layered plating layer which was easily split off the surface of the substrate steel due to the insufficiently activated surface condition of the steel sheet substrate to be coated.

It is to be noted from FIG. 3 that excellent corrosion resistance was obtained when vapor deposition plating was applied onto the surface of a steel sheet substrate held at a temperature of 100°–400° C. The influence of the surface temperature proves that the plating metal was vapor deposited on the surface of the steel sheet on which there was a high density of active spots and that the multi-layered plating layer had a dense structure free from defects.

On the other hand, alloying reaction occured between the first and second sub-layers when vapor deposition plating was applied onto the surface of a steel sheet substrate held at a temperature of 500° C.. The obtained plating layer did not have the intrinsic properties of the multi-layered plating layer. When the first sub-layer was formed on the surface of the steel sheet substrate held at a temperature below 100° C., the obtained plating layer had low density and slightly poorer corrosion resistance. When vapor deposition plating was applied to either a steel sheet substrate unitradiated with ion beams or a steel sheet substrate irradiated with ion beams in a small quantity of 0.03 coulomb/m$^2$, the obtained plating layer contained many defects and had poor corrosion resistance.

In the embodiment mentioned above, multi-layered plating is explained as an example. The steel sheet coated with a multi-layered plating layer by vapor deposition especially in the combination of Al and Ti is excellent in all of corrosion resistance, heat resistance and workability. These excellent properties are due to the fact that galvanic electric current between the plating layer and the substrate steel is inhibited, and a brittle Al-Fe alloy layer is not formed at the boundary between the plating layer and the substrate steel.

A conventional steel sheet coated with an Al plating layer suffered from a pitting corrosion reaction. The corrosion reaction was caused by defects existent in the oxide film on the surface of the Al plating layer. The oxide film, although being stable, is not necessarily continuous but involves defects such as pin holes. Al is selectively corroded by Cl$^-$ at the defect cites. The pitting corrosion continues until the surface of the steel substrate is exposed to the atmosphere. As a result, a local cell is formed between the Al plating layer and the substrate steel, resulting in the flow of galvanic electricity.

The galvanic electricity flowing at this time is so large in quantity that it accelerate the local dissolution of the plating layer and expand the dissolution of the plating layer to the surroundings. When the dissolution of the plating layer advances to the extent where the effect of Al acting as a sacrifice anode on the substrate steel is no longer occurs, the corrosion of the substrate steel begins and rust is formed in a short time. In this consequence, it is necessary to inhibit the flow of galvanic electricity between the plating layer and the substrate steel in order to improve the pitting corrosion resistance of the coated steel sheet. In addition, an Al-Fe alloy layer is likely to form and grow between the plating layer and the substrate steel when the Al-coated steel sheet is heated. The Al-Fe alloy layer, being brittle, significantly deteriorates the heat resistance and workability of the Al-coated steel sheet. On the contrary, the steel sheet coated with a multi-layered plating layer by the vapor deposition method wherein Ti and Al are applied as the first and second sub-layers, respectively, exhibits improved corrosion resistance owing to the co-operative effect of the Ti sub-layer with the Al sub-layer. Consequently, it takes a long time for pitting holes to go through to the steel sheet. The coated steel sheet is improved in heat resistance and workability, too. These excellent properties are obtained from the reasons as follows:

① The second sub-layer Al is electrolytically basic compared with the first sub-layer Ti. Even when pitting corrosion occurs in the Al layer, the development of the pitting corrosion is suppressed by the first sub-layer Ti which is hard to corrode. Consequently, it takes a longer time for pitting corrosion to reach the surface of the substrate steel.

② The first sub-layer Ti is covered with Al(OH)$_3$ or the like which is the corrosion products of the second sub-layer Al. The covered first sub-layer shows nearly the same electrolyrical property as that of the second sub-layer Al. Consequently, galvanic electricity flowing between the first and second sub-layers is fairly small in quantity, and the development of pitting corrosion to the surroundings is substantially suppressed as compared with the case of single Al plating.

③ Even if pitting corrosion reaches a part of the first sub-layer Ti creating pin holes, the second sub-layer Al exhibits the effect of a sacrificial anode on the substrate steel. Consequently, the substrate steel does not suffer from corrosion, regardless of being electrolytically basic compared with the first sub-layer Ti. In addition, owing to the small exposed surface area of the substrate steel, the galvanic electric current of a local cell formed between the second sub-layer Al and the substrate steel is suppressed even lower. Hereby, the corrosion speed of the second sub-layer is very slow.

④ Even when pitting corrosion developes to the extent where the effect of the second sub-layer Al acting as a sacrifice anode on the first sub-layer Ti, is not to be expected pin holes existent in the first sub-layer Ti are sealed with corrosion products from the second sub-layer Al. Consequently, the substrate-steel does not suffer from corrosion.

The reaction to form an alloy layer hardly occurs between the first sub-layer Ti and the substrate steel, even when the coated steel sheet is heated at a high temperature. Consequently, the property of the plating layer is not deteriorated at all even in a high-temperature atmosphere, and its excellent heat resistance is maintained for a long time.

⑥ In a conventional hot-dip Al-coated steel sheet, a brittle Al-Fe-Si intermetallic compound layer is formed between the plating layer and the substrate steel. The intermetallic compound layer causes the formation of cracks when reforming such as drawing is applied to the coated steel sheet. The cracks formed in the intermetallic compound layer would develop and reach the surface of the plating layer. On the other hand, such a brittle intermetallic compound is not formed in the steel sheet coated with the multi-layered plating layer comprising the first sub-layer of Ti and the second sub-layer of Al. Consequently, the coated steel sheet can be reformed with high work ratio by drawing, ironing or the like, without the formation of cracks in the plating layer. Hereby, the coated steel sheet can be reformed to an objective shape with good workability without the formation of defects such as powdering or flaking.

The present invention is applicable not only for the production of a steel material coated with a multi-layered plating layer but also for a steel material coated with a single plating layer, as far as the surface of the steel material to be coated is activated by the application of ion beams and maintained at a temperature within the range of 100°–400° C. In case of forming a single plating layer, the obtained plating layer has excellent properties and inhibits diffusion reaction between the plating layer and the substrate steel. Thereby, the coated steel sheet is excellent in corrosion resistance and workability.

Example 2: (Al-Zn alloy plating)

An annealed Ti-containing steel sheet of 0.6 mm in thickness was alkaline degreased and cut to a test piece having a size of 190 mm $\times$ 190 mm. This test was used as a substrate sheet to be coated. It was located in the vacuum chamber 10 of the same vapor deposition plating apparatus as that in Example 1. The pressure of the atmospere in the vacuum chamber 10 was maintained at $1 \times 10^{-3}$ Pa. While the surface of each test piece was held at various temperatures within the range from ambient temperature to 500° C., each test piece was irradiated with ion beams under the same conditions as those in Example 1.

Zn and Al materials were individually received in different vessels and evaporated by electron beam heating. The Zn material was granulated Zn having a purity of 99.9%, while the Al material was granulated Al having a purity of 99.99%. The evaporation speed of each of the Zn and Al was controlled by changing the output power of electron beams so as to form a Zn-Al alloy plating layer having a predetermined composition by vapor deposition. In any cases, conditions for the evaporation were adjusted to form an objective plating layer consisting of 80 wt. % Al and 20 wt. % Zn in an adhered amount of 17 g/m$^2$.

Each test piece coated with the vapor deposited Al-Zn plating layer was subjected to tests for examining adhesiveness, corrosion resistance, phosphatability and after-painting corrosion resistance. The test results were studied in relationship with the temperature of the steel sheet during vapor deposition and the quantity of applied ion beams. The relationships are shown in Table 1.

Adhesiveness was examined by a bending test as follows: The test piece was bent while holding the plating layer outside, until its surface part came into face-to-face contact with itself. An adhesive tape was put on the bent part of the test piece and then peeled off. Some of the plating layer was removed from the surface of the test piece in a state sticking onto the adhesive tape. The adhesiveness was judged from the state of the plating layer remaining on the surface of the steel sheet. In Table 1, the mark ◯ represents the case where any peeling was not detected in the plating layer, while the mark x represents the case where the peeling was detected. The test pieces which showed poor adhesiveness were not used for the tests hereinafter.

Corrosion resistance was examined by a salt water spray test according to JIS Z2371, and judged from a spray time until the formation of 5% rust. In Table 1, the mark ◯ represents the case where 5% rust was not detected even after the continuation of salt water spraying for 200 hrs., the mark Δ represents the case where 5% rust was detected in 100–200 hrs. during salt water spraying, and the mark x represents the case where 5% rust was detected in the spray time of 100 hrs. or shorter.

Phosphatability was examined as follows: A coated steel sheet was dipped for 15 sec. in a degreasing bath held at 40° C., and then subjected to phosphating treatment by dipping it for 2 min. in a phosphating solution held at 40° C. A phosphate film formed on the steel sheet was observed by SEM in the field of 1000-multiplied view to investigate the condition of precipitated phosphate crystals. In Table 1, the mark ◯ represents the case where fine phosphate crystals were uniformly and densely precipitated, the mark Δ represents the case where coarse phosphate crystals were non-uniformly precipitated, and the mark x represents the case where phosphate crystals were scarcely precipitated.

After-painting corrosion resistance was examined as follows: The coated steel sheet after being subjected to the phosphating treatment was coated with a cation type electrodeposition paint film of 20 $\mu$m in thickness, scratched with cross cuts and then subjected to a salt water spray test. After the salt water spraying was continued for 40 days, the width (mm) of blisters formed in the paint film was measured.

TABLE 1

EFFECTS OF CONDITIONS FOR VAPOR DEPOSITION ON PROPERTIES OF PLATTING LAYER

| SAMPLE No. | ION BEAMS (coulomb/m$^2$) | SURFACE TEMP. DURING VAPOR DEPOSITION (°C.) | PROPERTIES | | | |
|---|---|---|---|---|---|---|
| | | | I | II | III | IV |
| A1 | not applicable | 450 | X | — | — | — |
| A2 | | 350 | ◯ | Δ | ◯ | 10 |
| A3 | | 250 | ◯ | Δ | ◯ | 10 |
| A4 | | 150 | X | — | — | — |
| B1 | 0.03 | 450 | X | — | — | — |
| B2 | | 350 | ◯ | Δ | ◯ | 7 |
| B3 | | 250 | ◯ | Δ | ◯ | 8 |
| B4 | | 150 | X | — | — | — |
| C1 | 0.05 | 450 | X | — | — | — |
| C2 | | 350 | ◯ | ◯ | ◯ | 3 |
| C3 | | 250 | ◯ | ◯ | ◯ | 3 |
| C4 | | 150 | ◯ | ◯ | ◯ | 4 |
| D1 | 0.1 | 450 | X | — | — | — |
| D2 | | 350 | ◯ | ◯ | ◯ | 3 |
| D3 | | 250 | ◯ | ◯ | ◯ | 3 |
| D4 | | 150 | ◯ | ◯ | ◯ | 3 |
| E1 | 1.0 | 450 | X | — | — | — |
| E2 | | 350 | ◯ | ◯ | ◯ | 3 |
| E3 | | 250 | ◯ | ◯ | ◯ | 3 |
| E4 | | 150 | ◯ | ◯ | ◯ | 3 |

(PROPERTIES)
I: adhesiveness
II: corrosion resistance
III: phosphatability
IV: after-painting corrosion resistance It is clearly noticed in Table 1 that excellent adhesiveness was obtained when vapor deposition plating was applied to a test piece having a surface irradiated with ion beams in a quantity of 0.05 coulomb/m$^2$ or more and held at a temperature of 400° C. or lower.

On the other hand, defects such as cracks and splits were observed in the bending test when the vapor deposition plating layer formed on the test piece had a surface held at a temperature exceeding 400° C. An alloy plating layer which easily separate from substrate steel was formed by vapor deposition on the test piece having either a surface held at 150° C. without the application of ion beams or a surface irradiated with ion beams in a small quantity of 0.03 coulomb/m$^2$.

The test piece, coated with an alloy plating layer under the conditions of ion beam application in a quantity of 0.05 coulomb/m$^2$ or more and a surface temperature of 400° C. or lower defined in the present invention, was excellent in corrosion resistance too. The improvement in corrosion reistance proves that the alloy plating layer was densely formed without defects, since the surface having active spots with high density was subjected to the vapor deposition of plating metals.

Phosphate crystals were densely and uniformly precipitated on all the plating layers which had excellent corrosion resistance. All the test pieces prepared under manufacturing conditions defined in the present invention exhibited excellent after-painting corrosion resistance, too.

A plurality of Al-Zn alloy plating layers were formed on the surfaces of test pieces by simultaneously vapor depositing Zn and Al on the surfaces having irradiated with ion beams in a quantity of 0.1 coulomb/m² and held at 250° C. The compositions of the plating layers were variously changed by controlling the conditions of vapor deposition. The coated test pieces were examined for corrosion resistance, phosphatability and after-painting corrosion resistance in the same way as those used in Table 1. The results are shown in Table 2, wherein the composition (wt. %) of each plating layer is represented by that at its surface.

TABLE 2

EFFECTS OF COMPOSITION ON PROPERTIES OF PLATING LAYER

| SAMPLE No. | ADHESION AMOUNT (g/m²) | COMPOSITON OF PLATING LAYER | | PROPERTIES | | |
|---|---|---|---|---|---|---|
| | | Zn | Al | II | III | IV |
| F1 | 10.0 | 2 | 98 | Δ | Δ | 9 |
| F2 | | 4 | 96 | Δ | ◯ | 7 |
| F3 | | 25 | 75 | Δ | ◯ | 7 |
| F4 | | 40 | 60 | X | ◯ | 8 |
| G1 | 17.0 | 0 | 100 | ◯ | X | 17 |
| G2 | | 2 | 98 | ◯ | Δ | 7 |
| G3 | | 4 | 96 | ◯ | ◯ | 3 |
| G4 | | 25 | 75 | ◯ | ◯ | 3 |
| G5 | | 40 | 60 | Δ | ◯ | 6 |
| G6 | | 80 | 20 | X | ◯ | 8 |
| H1 | 24.0 | 2 | 98 | ◯ | Δ | 8 |
| H2 | | 4 | 96 | ◯ | ◯ | 3 |
| H3 | | 25 | 75 | ◯ | ◯ | 3 |
| H4 | | 40 | 60 | Δ | ◯ | 5 |

(PROPERTIES)
II: corrosion resistance
III: phosphatability
IV: after-painting corrosion resistance It is apparent from Table 2 that all the test pieces prepared by the treatments according to the present invention were excellent in corrosion resistance, phosphatability and after-painting corrosion resistance. Especially, the test piece containing Zn in an amount defined in the present invention, even if it was treated in a coating process line designed for applying paint to Zn-plated steel sheets, provided a surface capable of being coated with a paint film having properties similar to those of a paint film which was formed on the surface of a conventional Zn-plated steel sheet.

ADVANTAGES OF THE INVENTION

According to the present invention as above-mentioned, the surface of a steel material is irradiated with ion beams in a specified quantity and held at a temperature within the range of 100°–400° C. until vapor deposition plating was completed. The plating layer formed on the steel material is excellent in adhesiveness, corrosion resistance, workability, after-painting corrosion resistance and conformability to a paint film to be formed thereon, without the formation of brittle intermetallic compounds or the like between the substrate steel and the plating layer. In case where a second sub-layer is to be formed on a first sub-layer by the same vapor deposition plating, a multi-layered plating layer having objective properties is obtained without mutual diffusion or alloying reaction between the first and second sub-layers. On the other hand, a vapor deposition Al-Zn alloy plating layer, whose Zn content is controlled within the range of 3–30 wt. % at its surface, serves as a substrate surface which is excellent in phosphatability, conformability to paint and after-painting corrosion resistance, even when the coated steel material is treated in a conventional paint applying process line designed for Zn-coated steel sheets.

What is claimed is:
1. A method of forming a vapor deposition plating layer comprising:
    impinging at least one argon ion beam, in a quantity of at least 0.05 coulomb/m² to at least one surface of a steel material under conditions sufficient to etch said steel surface;
    bringing said steel surface to a temperature in the range of 100° to 400° C.;
    while said surface is at said temperature and is in a vacuum, vapor depositing on said surface an aluminum first metal and a second metal selected from the group of at least one of zinc and titanium; and
    depositing said first and second metals on said surface of said steel.
2. The method of forming a vapor deposition plating layer claimed in claim 1, wherein the vapor deposition plating layer is formed in a multi-layered state by successively vapor depositing said first and second plating metals.
3. The method of forming a vapor deposition plating layer claimed in claim 1, wherein the vapor deposition plating layer is formed from Al and Zn vapors thermally evaporated from different vessels.
4. The method of forming a vapor deposition plating layer as claimed in claim 1 wherein the vapor deposition plating layer is formed in an alloy state by simultaneously vapor depositing said first and second plating metals.
5. The method of forming a vapor deposition plating layer as claimed in claim 1 wherein the vapor deposition plating layer is formed from aluminum and titanium.

* * * * *